United States Patent [19]

Wakabayashi et al.

[11] 4,340,908
[45] Jul. 20, 1982

[54] CONTROL LEVEL DISPLAYING APPARATUS

[75] Inventors: Hideo Wakabayashi, Souka; Kenro Teraoka, Yokohama, both of Japan

[73] Assignee: Sony Corporation, Tokyo, Japan

[21] Appl. No.: 209,144

[22] Filed: Nov. 21, 1980

[30] Foreign Application Priority Data

Nov. 22, 1979 [JP] Japan .................. 54-161918[U]

[51] Int. Cl.³ .............................................. H04N 5/44
[52] U.S. Cl. ............................ 358/194.1; 358/192.1; 358/188; 455/159
[58] Field of Search .................. 358/188, 192.1, 194.1; 455/157–159, 154, 155, 177, 200

[56] References Cited

U.S. PATENT DOCUMENTS

| | | | |
|---|---|---|---|
| 3,854,123 | 12/1974 | Banach | 358/194.1 |
| 4,214,273 | 7/1980 | Brown | 358/192.1 |
| 4,270,216 | 5/1981 | Suzuki | 455/159 |

*Primary Examiner*—Michael A. Masinick
*Attorney, Agent, or Firm*—Lewis H. Eslinger; Alvin Sinderbrand

[57] ABSTRACT

A control level displaying apparatus includes a remote control signal receiving circuit having a discriminating circuit for producing a sound volume up/down control signal and at least one up/down characteristic control signal relating to at least one other characteristic of a received information signal in response to a received remote control signal, a sound volume control generating circuit for producing a sound volume control voltage in response to the sound volume up/down control signal, a second control voltage generating circuit for producing at least one characteristic control voltage in response to the at least one up/down characteristic control signal, a sound volume control circuit for controlling the sound volume in response to the sound volume control voltage from the sound volume control generating circuit, a second control circuit for controlling the at least one other characteristic in response to the at least one characteristic control voltage from the second control generating circuit, a control level displaying circuit for displaying the level of one of the control voltages, a supply circuit for selectively supplying the sound volume control voltage or the at least one characteristic control voltage to the control level displaying circuit, and a switch control circuit for controlling the operation of the supply circuit in response to the at least one up/down characteristic control signal so as to supply the at least one characteristic control voltage to the control level displaying circuit when a remote control signal for the at least one other characteristic is received by the remote control signal receiving circuit.

6 Claims, 2 Drawing Figures

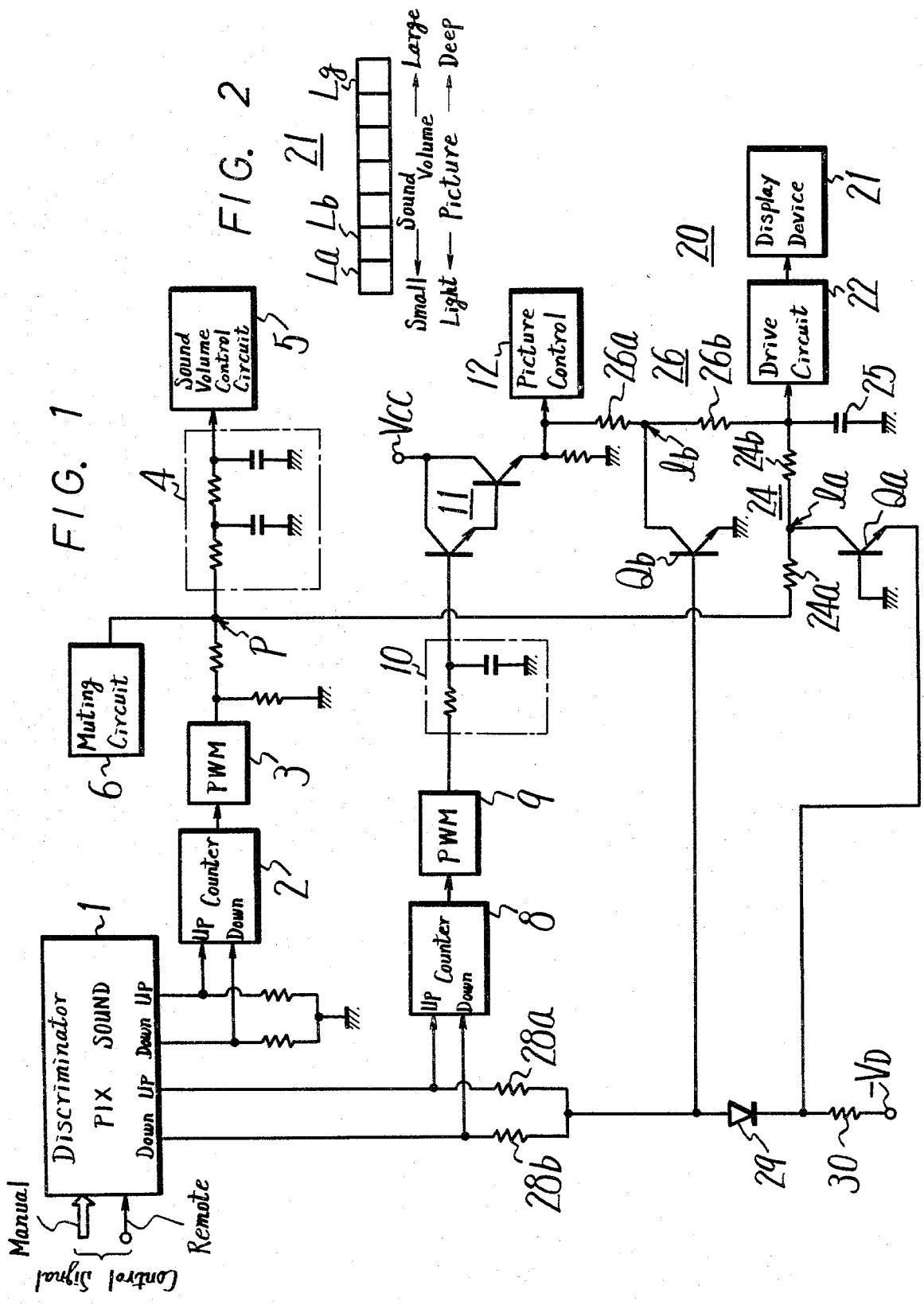

CONTROL LEVEL DISPLAYING APPARATUS

BACKGROUND OF THE INVENTION

1. Field of the Invention

The present invention relates generally to a control level displaying apparatus and, more particularly, is directed to a control level displaying apparatus for use with a television receiver for visually displaying various amounts of different characteristics, such as sound volume, saturation, hue and picture, on a single display device.

2. Description of the Prior Art

In the case where adjustment or control of color saturation, hue, or picture, the latter occurring when the color saturation and contrast are simultaneously adjusted, is performed by remote control operation, if the adjustment or control is carried out while the amount of adjustment or control is visually ascertained, such adjustment or control can be easily and positively achieved. In such case, if the optimum adjusting point is known, the amount of deviation from the optimum adjusting point caused by a manual adjustment operation is helpful in adjusting or controlling the saturation, hue and picture.

Accordingly, it is sufficient to provide a separate display device on the panel of the television receiver. However, since the level of adjustment or control for characteristics such as picture, hue and the like to be adjusted is much less than that for sound adjustment or the like, the efficiency of the separate display device in use is low.

In prior art television receivers in which the channel, sound volume and the like can be remotely controlled, it is known to provide a display device for indicating the adjusted or controlled level of sound volume on the panel of the television receiver whereby control of the sound volume control can be preformed from a remote place. This prior art display device, however, can not display characteristics other than the sound volume, such as hue, saturation or picture.

OBJECTS AND SUMMARY OF THE INVENTION

Accordingly, it is an object of the present invention to provide a novel control level displaying apparatus that avoids the above-described difficulties encountered with the prior art.

It is another object of the present invention to provide a control level displaying apparatus which utilizes a display device for displaying the level of the adjusted sound volume and the amount of adjustment of the picture, hue and the like.

In accordance with an aspect of this invention, a control level displaying apparatus for an information signal receiving apparatus of the type having sound volume control means for controlling the volume of sound of a received information signal and second control means for controlling at least one other characteristic of the received information signal, includes:

control signal receiving means having discriminating means for producing at least one of a sound volume discriminated signal and at least one other discriminated signal, in response to a received control signal;

sound volume control generating means for producing a sound volume control signal in response to the sound volume discriminated signal and for supplying the sound volume control signal to the sound volume control means;

second control generating means for producing at least one characteristic control signal in response to the at least one other discriminated signal and for supplying the at least one characteristic control signal to the second control means;

control level displaying means for displaying the level of a signal supplied thereto;

supply means for selectively supplying one of the sound volume control signals and the at least one characteristic control signal to the control level displaying means, and switch control means for controlling the operation of the supply means in response to one of the sound volume discriminated signal and the at least one other discriminated signal.

The above other, objects, features and advantages of the present invention will become apparent from the following description of an illustrative embodiment of the invention which is to be read in connection with the accompanying drawings.

BRIEF DESCRIPTION OF THE DRAWINGS

FIG. 1 is a circuit wiring-block diagram of a control level displaying apparatus according to one embodiment of the present invention; and FIG. 2 is a schematic diagram used to explain the arrangement of the display elements used in the embodiment of the invention shown in FIG. 1.

DETAILED DESCRIPTION OF THE PREFERRED EMBODIMENT

Referring to the drawings in detail, and initially to FIG. 1 thereof, there is shown a control level displaying apparatus according to one embodiment of the present invention in which the previously-discussed known display device previously used for displaying the level of sound volume is also used as a display device for displaying a the level of a picture controlled characteristic.

As shown therein, a discriminating circuit 1 is provided in the receiving circuitry of a color television receiver for receiving control signals corresponding to various characteristics to be controlled. In particular, discriminating circuit 1 is preferably formed of a micro computer and other like elements to which control signals (regardless of whether they are remote control signals or control signals provided by selection from a panel) corresponding to characteristics to be controlled, such as the channel, sound volume, picture and the like are applied. These control signals are discriminated in discriminating circuit, and signals corresponding to the respective control signals are delivered from respective output terminals of discriminating circuit 1. It should be appreciated that although only the output terminals relating to sound volume and picture are illustrated in FIG. 1, other output terminals relating to other characteristics may be used.

When no control signals are applied to discriminating circuit 1, its respective output terminals each supply a high level signal (above 12 V), while and when control signals are applied to discriminating circuit 1, the corresponding output terminals thereof each supply a low level signal. For example, if it is desired to increase the sound volume, the signal produced at the respective UP output-terminal of discriminating circuit 1 falls to a low level by reason of a control signal being supplied to discriminating circuit 1 for increasing the sound volume.

The UP-and DOWN-outputs from discriminating circuit 1 which relate to the sound volume are applied to UP and DOWN-inputs, respectively, of UP/DOWN counter 2 and the output therefrom is fed to a PWM (pulse width modulation) circuit 3. PWM circuit 3 produces a pulse output having a pulse width corresponding to the output from UP/DOWN counter 2. The pulse output from PWM circuit 3 is supplied to a low pass filter 4 through a point P where it is smoothed as a DC output for adjusting or controlling the sound volume. The DC output from low pass filter 4 is, in turn, fed to a sound volume control circuit 5. A muting circuit 6 for attenuating a vocal signal may be connected to point P.

The UP-and DOWN-outputs from discriminating circuit 1 which relate to the picture adjustment or control are fed to UP and DOWN-inputs, respectively, of an UP/DOWN counter 8, the output of which is then supplied to a PWM circuit 9 to be converted into a pulse output having a given pulse width. This pulse output from PWM circuit 9 is fed to a low pass filter 10 where it is converted into a DC output which is amplified by an amplifier or emitter-follower circuit 11 of, for example, a Darlington connection, and is then supplied to a picture control circuit 12.

A display circuit 20 is provided which is comprised of a display device 21 and its associated drive circuit 22, the latter being supplied with the pulse output from PWM circuit 3 through a series connection 24 of a pair of resistors 24a and 24b. A smoothing capacitor 25 is connected between ground and the connection point of resistor 24b and drive circuit 22.

Display device 21 preferably includes a plurality of display elements L ($L_a$, $L_b$, . . . $L_g$ in the illustrated embodiment, such as LEDs (light emitting diodes) arranged in line, as shown in FIG. 2, so that the controlled amount is displayed in the manner of a bar-graph.

In the embodiment of the invention shown in FIG. 1, the DC output from emitter-follower circuit 11 is applied to drive circuit 22 through a series connection 26 of a pair of resistors 26a and 26b and, in particular, resistor 26b is connected to resistor 24b and to capacitor 25. NPN switching transistors $Q_a$ and $Q_b$ and, in particular, the collectors thereof, are connected to connection points $l_a$ and $l_b$ between resistors 24a and 24b and between resistors 26a and 26b, respectively. Resistors 28a and 28b are also provided and are each connected at one end thereof to the UP and DOWN output terminal, respectively, of discriminating circuit 1 which relate to the picture control and are connected together at the opposite ends thereof to a negative power source $-V_D$ (about −24 V) through a diode 29 and a resistor 30. The anode of diode 29 is connected to the base of the transistor $Q_b$ and cathode thereof is connected to the emitter of transistor $Q_a$. The base of the latter transistor $Q_a$ is grounded, and the emitter of the former transistor $Q_b$ is grounded.

When transistor $Q_a$ turns ON, its emitter potential lowers to $-V_{BE}$, as will be described hereinafter. Thus, if diode 29 is not provided, the potential at the output terminals of discriminating circuit 1 at such time becomes a negative potential which adversely affects discriminating circuit 1. This is the reason why diode 29 is provided.

The operation of the circuit of FIG. 1 as constructed above will be now described.

When the control signal which relates to the picture is not applied to discriminating circuit 1, the output terminals thereof each produce a signal of a high level. At this time, transistor $Q_b$ is turned ON but transistor $Q_a$ is turned OFF. Thus, the connection point $l_b$ between resistors 26a and 26b is grounded, so that the DC output of the pulse output from PWM circuit 3 is voltage-divided by resistors 24a, 24b, and 26b, and then applied to drive circuit 22. Therefore, when the control signal which relates to the sound volume is applied to discriminating circuit 1, the controlled amount (level) of sound is displayed by display device 21.

This level display state is maintained even in the absence of the sound volume control signal. Under such a state, if the control signal relating to the picture is applied to discriminating circuit 1, one of the respective UP-and DOWN-outputs is delivered therefrom. Thus, the picture control signal from one of the output terminals of discriminating circuit 1 falls to a low level, for example, becomes zero potential. At this time, transistor $Q_b$ is turned OFF while transistor $Q_a$ is turned ON, so that the connection point $l_a$ between resistors 24a and 24b is grounded.

When the connection point $l_a$ is grounded, the pulse output from PWM circuit 3 is grounded through resistor 24a and is therefore not applied to drive circuit 22. However, the DC output from the emitter-follower circuit 11 is voltage-divided by resistors 26a, 26b and 24b and then applied to drive circuit 22, so that in place of the sound volume control level, the picture control level is automatically displayed by display device 21.

When the supply of the picture control signal to discriminating circuit 1 is stopped, the potential at the anode of diode 29 returns to the high level again. Thus, the ON and OFF states of transistors $Q_a$ and $Q_b$ are inverted from the previous state and the sound volume control level may again be displayed by display device 21.

In this embodiment, in order that the potential at point P does not change much with respect to the ON- and OFF-states of transistor $Q_a$, the resistance value of transistor 24a is selected relatively large, for example, about 400 to 500 KΩ.

As described above, according to the present invention, the amount of control of the picture can be displayed, so that the picture control operation can be carried out while the amount of control is visually ascertained. Therefore, the picture control can be easily and positively achieved from a remote place.

Further, in accordance with this invention, the display device already provided for displaying the controlled sound volume is skillfully utilized to display the amount of control of the picture.

Although the above description has been given for the case where the sound volume and picture are combined, it will be apparent that the present invention can be applied to other combinations of characteristics to be controlled, such as the sound volume with color saturation, the sound volume with color saturation and hue, the sound volume with picture and hue, and so on, with the same effects.

Further, in the embodiment of FIG. 1, the UP/DOWN counter 2 and PWM circuit 3 may be formed of a D-A converter.

Having described a specific preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

We claim as our invention:

1. A control level displaying apparatus, comprising:

control signal receiving means including discriminating means for producing at least one of a sound volume control signal and at least one characteristic control signal relating to at least one other characteristic of a received information signal, in response to a received control signal;

sound volume control generating means for producing a sound volume control voltage in response to said sound volume control signal;

second control generating means for producing at least one characteristic control voltage in response to said at least one characteristic control signal;

a sound volume control circuit for controlling the sound volume in response to said sound volume control voltage from said sound volume control generating means;

a second control circuit for controlling said at least one other characteristic in response to said at least one characteristic control voltage from said second control generating means;

control level displaying means for displaying the level of one of said control voltages;

supply means for selectively supplying one of the sound volume control voltage and the at least one characteristic control voltage to said control level displaying means; and switch control means for controlling the operation of said supply means in response to said at least one characteristic control signal so as to supply said at least one characteristic control voltage to said control level displaying means when a control signal for said at least one other characteristic is received by said control signal receiving means.

2. In a control level displaying apparatus for an information signal receiving apparatus of the type having sound volume control means for controlling the volume of sound of a received information signal and second control means for controlling at least one other characteristic of the received information signal, the control level displaying apparatus comprising:

control signal receiving means including discriminating means for producing at least one of a sound volume discriminated signal and at least one other discriminated signal relating to said at least one other characteristic, in response to a received control signal;

sound volume control generating means for producing a sound volume control signal in response to said sound volume discriminated signal and for supplying said sound volume control signal to said sound volume control means;

second control generating means for producing at least one characteristic control signal in response to said at least one other discriminated signal and for supplying said at least one characteristic control signal to said second control means;

control level displaying means for displaying the level of signal supplied thereto;

supply means for selectively supplying one of said sound volume control signal and said at least one characteristic control signal to said control level displaying means; and switch control means for controlling the operation of said supply means in response to one of said sound volume discriminated signal and said at least one other discriminated signal.

3. The apparatus according to claim 2; in which said discriminating means includes first and second pairs of UP and DOWN-output terminals at which said sound volume discriminated signal and said at least one other discriminated signal are produced; said sound volume control generating means includes a first UP/DOWN counter having UP and DOWN-inputs supplied with said sound volume discriminated signal from said first pair of UP and DOWN-output terminals, respectively, a first pulse width modulation circuit supplied with the output of said first UP/DOWN counter for producing a first pulse output, and a first low pass filter supplied with said first pulse output for producing said sound volume control signal; and said second control generating means includes a second UP/DOWN counter having UP and DOWN-inputs supplied with said at least one other discriminated signal from said second pair of UP and DOWN-output terminals, respectively, a second pulse width modulation circuit supplied with the output of said second UP/DOWN counter for producing a second pulse output, and a second low pass filter supplied with said second pulse output for producing said at least one characteristic control signal.

4. The apparatus according to claim 2; in which said supply means includes a first resistive path for supplying said sound volume control signal to said control level displaying means and a second resistive path for supplying said at least one characteristic control signal to said control level displaying means.

5. The apparatus according to claim 4; in which said switch control means includes a first switching element for connecting said first resistive path to a reference potential in response to one of said sound volume discriminated signal and said at least one other discriminated signal, and a second switching element for connecting said second resistive path to a reference potential in response to one of said second volume discriminated signal and said at least one other discriminated signal.

6. The apparatus according to claim 5; in which said first switching element includes a first bi-polar junction transistor having its collector-emitter path connected between ground potential and said first resistive path and its base supplied with one of said sound volume discriminated signal and said at least one other discriminated signal and said second switching element includes a second bi-polar junction transistor having its collector-emitter path connected between ground potential and said second resistive path and its base supplied with one of said sound volume discriminated signal and said at least one other discriminated signal.

* * * * *